(12) United States Patent
Huang

(10) Patent No.: US 10,199,579 B2
(45) Date of Patent: Feb. 5, 2019

(54) SELF-POWERED GHZ SOLUTION-PROCESSED HYBRID PEROVSKITE PHOTODETECTORS

(71) Applicant: NUtech Ventures, Lincoln, NE (US)

(72) Inventor: Jinsong Huang, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 15/691,479

(22) Filed: Aug. 30, 2017

(65) Prior Publication Data

US 2018/0075977 A1    Mar. 15, 2018

Related U.S. Application Data

(63) Continuation-in-part of application No. 15/009,701, filed on Jan. 28, 2016, now Pat. No. 9,812,660, which
(Continued)

(51) Int. Cl.
| | |
|---|---|
| H01L 51/00 | (2006.01) |
| H01G 9/20 | (2006.01) |
| H01L 51/44 | (2006.01) |
| G01J 1/42 | (2006.01) |
| G01J 1/04 | (2006.01) |
| C30B 7/06 | (2006.01) |
| C30B 29/54 | (2006.01) |
| H01L 27/30 | (2006.01) |
| H01L 31/076 | (2012.01) |

(Continued)

(52) U.S. Cl.
CPC ............ *H01L 51/0046* (2013.01); *C30B 7/06* (2013.01); *C30B 29/54* (2013.01); *G01J 1/0411* (2013.01); *G01J 1/42* (2013.01); *H01G 9/2009* (2013.01); *H01L 27/302* (2013.01); *H01L 31/076* (2013.01); *H01L 51/0047* (2013.01); *H01L 51/424* (2013.01); *H01L 51/448* (2013.01); *H01L 51/4213* (2013.01); *H01L 51/4273* (2013.01); *H01L 2031/0344* (2013.01); *Y02E 10/549* (2013.01)

(58) Field of Classification Search
CPC .................................................. H01L 51/0046
See application file for complete search history.

(56) References Cited

U.S. PATENT DOCUMENTS

| | | | |
|---|---|---|---|
| 5,871,579 A * | 2/1999 | Liang | C23C 2/04 117/54 |
| 9,082,992 B2 * | 7/2015 | Guo | H01L 51/424 |

(Continued)

OTHER PUBLICATIONS

Agilent Infiniium 8000Series Oscilloscopes, Data sheet, pp. 1-33, Jul. 20, 2013.*

*Primary Examiner* — William Coleman
(74) *Attorney, Agent, or Firm* — Leydig, Voit & Mayer, Ltd.; Gerald T. Gray

(57) ABSTRACT

Organic-inorganic hybrid perovskite (OIHP) based photoresponsive devices include an OIHP active layer disposed between a cathode layer and an anode layer, and an electron extraction layer disposed between the cathode layer and the active layer. The electron extraction layer includes a layer of $C_{60}$ directly disposed on the active layer. The active layer includes an organometal trihalide perovskite layer (e.g., $CH_3NH_3PbI_2X$, where X includes at least one of Cl, Br, or I).

12 Claims, 7 Drawing Sheets

Related U.S. Application Data is a continuation-in-part of application No. 14/576,878, filed on Dec. 19, 2014, now Pat. No. 9,391,287.

(60) Provisional application No. 62/381,412, filed on Aug. 30, 2016, provisional application No. 62/108,863, filed on Jan. 28, 2015, provisional application No. 61/918,330, filed on Dec. 19, 2013.

(51) Int. Cl.
  *H01L 51/42* (2006.01)
  *H01L 31/0256* (2006.01)

(56) References Cited

U.S. PATENT DOCUMENTS

| | | | |
|---|---|---|---|
| 2016/0155974 A1* | 6/2016 | Wang | H01L 51/4226 136/263 |
| 2017/0236651 A1* | 8/2017 | Bakr | H01G 9/2009 136/263 |

* cited by examiner

Figure 2a
Figure 2b
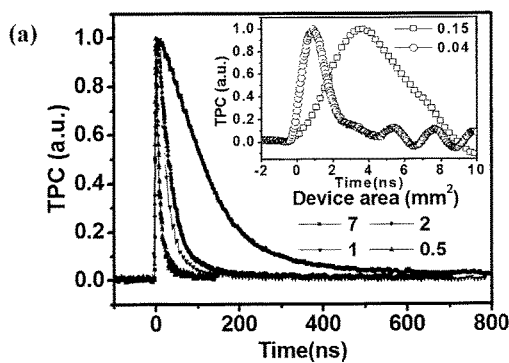
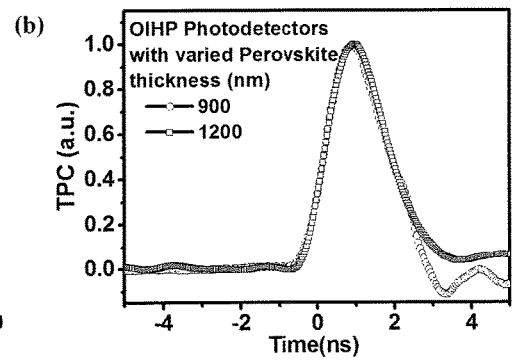
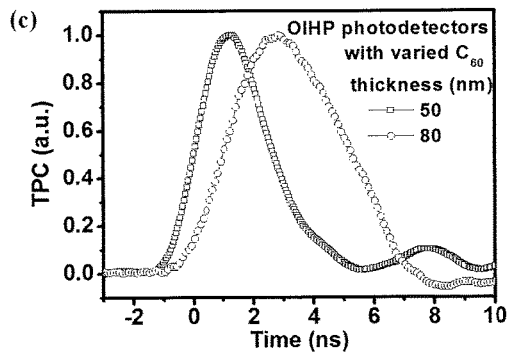
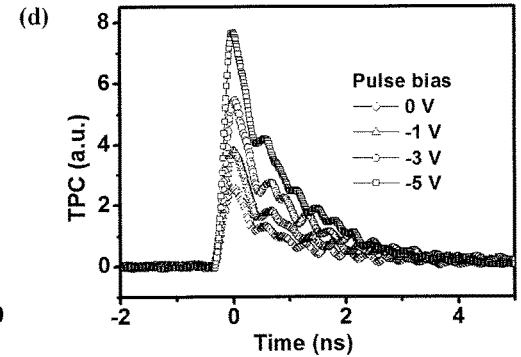
Figure 2c
Figure 2d Figure 4a
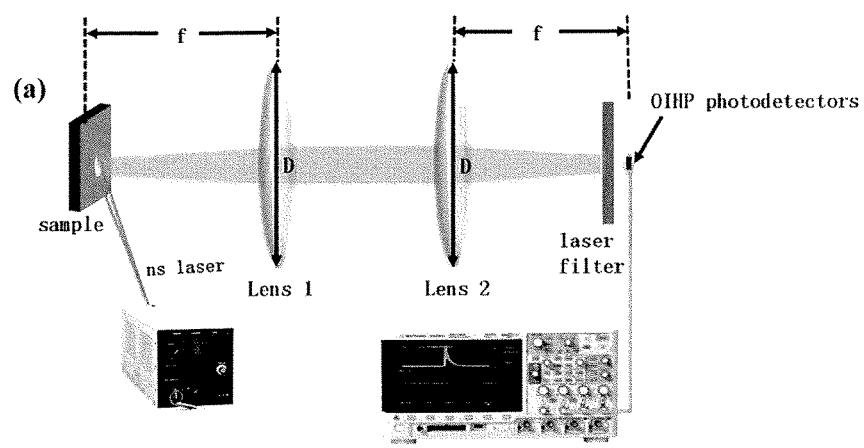
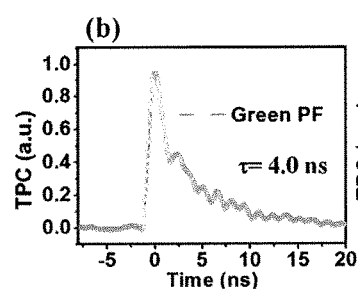
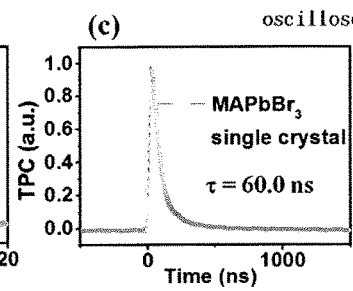
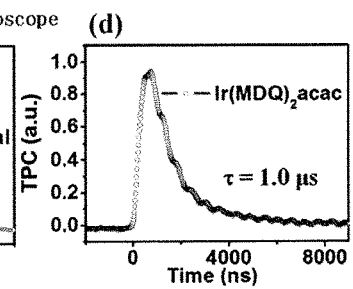
Figure 4b     Figure 4c     Figure 4d

SELF-POWERED GHZ SOLUTION-PROCESSED HYBRID PEROVSKITE PHOTODETECTORS

CROSS-REFERENCE TO RELATED APPLICATIONS

This patent application is a Continuation-in-Part of U.S. Non-provisional Patent Application No. 15/009,701, filed Jan. 28, 2016, which claims the benefit of U.S. Provisional Application No. 62/108,863, filed Jan. 28, 2015, and is a Continuation-in-Part of U.S. Non-provisional Patent Application No. 14/576,878, filed Dec. 19, 2014, (now U.S. Pat. No. 9,391,287), which claims the benefit of U.S. Provisional Patent Application No. 61/918,330, filed on Dec. 19, 2013, all of which are incorporated herein by reference. This application also claims the benefit of U.S. Provisional Patent Application No. 62/381,412, filed Aug. 30, 2016, which is incorporated herein by reference.

FEDERALLY SPONSORED RESEARCH OR DEVELOPMENT

This invention was made with Government support under contract N000141210556 awarded by The Office of Naval Research, and under contract 2014-DN-077-ARI069-02 awarded by The Department of Homeland Security. The Government has certain rights in this invention.

BACKGROUND

The present disclosure generally provides photodetector systems and methods, and more particularly photodetector systems and methods including perovskite photoactive or photoresponsive materials.

Ultrafast solid-state semiconductor photodetector devices have many important applications including fast imaging, high-speed optical communication, ultrafast dynamic process monitoring, in the fields of consumer electronics, industry, defense, and academic research. These devices heavily rely on traditional inorganic semiconductor materials such as silicon, indium gallium arsenide, gallium nitride, et al, which are generally deposited by expensive, slow, high temperature processes such as molecular beam epitaxy (MBE) and metal-organic chemical vapor deposition (MOCVD). Solution processed semiconductors, including organic semiconductors and nanomaterials, are increasingly exploited in photodetection applications due to their many intrinsic advantages. These materials can be deposited by established low-cost, versatile solution techniques, such as spin-coating, slot-die coating, ink-jet printing, gravure coating, etc., on many different types of substrates, including both rigid and flexible or even curves surfaces. Large size arrays can be directly printed with high throughput printing processes, which avoid the patterning steps in traditional semiconductor techniques. There has been tremendous progress made in the past decade in improving the sensitivity, extending response spectrum to ultraviolet and near infrared, increasing linear dynamic range of these solution-processed photodetectors, see, e.g., Gong X, et al. High-detectivity polymer photodetectors with spectral response from 300 nm to 1450 nm. Science 325, 1665-1667; Zhang L, et al. Toward highly sensitive polymer photodetectors by molecular engineering. Adv. Mater. 27, 6496-6503 (2015); and Fang Y, Guo F, Xiao Z, Huang J. Large Gain, Low Noise Nanocomposite Ultraviolet Photodetectors with a Linear Dynamic Range of 120 dB. Adv. Opt. Mater. 2, 348-353 (2014).

The sensitivity of the solution-processed photodetectors have already surpassed traditional inorganic semiconductor photodetectors in most spectral ranges, including ultraviolet (UV), visible, and near-infrared (NIR), and the linear dynamic range has also surpass that of best inorganic photodetectors. See, e.g., Guo F, et al. A nanocomposite ultraviolet photodetector based on interfacial trap-controlled charge injection. Nature Nanotech. 7, 798-802 (2012); and Wei H, Fang Y, Yuan Y, Shen L, Huang J. Trap Engineering of CdTe Nanoparticle for High Gain, Fast Response, and Low Noise P3HT:CdTe Nanocomposite Photodetectors. Adv. Mater. 27, 4975-4981 (2015). Nevertheless, despite of the significant progress in these aspects, one challenge to be addressed is the low response speed of the solution-processed photodetectors. For the application of solution-processed photodetectors as imagers in consumer electronics, millions of pixels need to be read-out in a timeframe of milliseconds or less for each image frame, and the frame rate needs to be high enough to display consecutive images. Most of organic semiconductors have low drift mobility of <0.01 $cm^2$ $V^{-1}$ $s^{-1}$, making the response speed of organic photodetectors generally in the megahertz (MHz) range despite small active layer thickness of less than about 200 nanometers (nm). Photodetectors made of inorganic semiconductor nanoparticles generally employ lateral structures, due to the difficulty to form leakage-free, compact films for vertical structure devices; therefore the charge transit-time is much longer than in vertical-structure devices due to the long channel length despite their larger mobility in the range of 0.1-30 $cm^2$ $V^{-1}$ $s^{-1}$. In addition, the presence of charge traps in many of these solution-processed semiconductors, sometimes intentionally introduced to generate a photoconductive gain, inevitably slow-down their response speed.

Organic-inorganic hybrid perovskites (OIHP) have recently emerged as a new generation of promising materials for solar cell absorbers, yielding power conversion efficiencies of greater than 20%, benefiting from their super intrinsic optoelectronic properties including tunable bandgap, high absorption coefficient, low exciton binding energy, high mobility, and long carrier diffusion length. Recently, the applications of OIHP extended widely to other fields such as light emitting diodes, lasers, photodetectors, X-ray detectors, etc. For OIHP photodetectors, both high-gain photoconductive type and low-noise photodiode type photodetectors have been reported recently. OIHP photodetectors also have unique advantages for imagers in digital cameras, because their bandgap enables the response only to visible light, while silicon based imagers always need a filter to block infrared light to enhance the imaging quality. Despite the rapid progress in sensitivity enhancement of perovskite photodetectors, however, little is known about how fast the OIHP photodetectors can operate.

Despite of the high sensitivity demonstrated, the response speeds of solution-processed photodetectors are generally low due to the low carrier mobility and the long charge traps of most solution-processed semiconductors.

BRIEF SUMMARY

The present disclosure provides solution-processed OIHP photo-sensitive devices, such as photodetectors, with fast, e.g., GHz response speeds. In certain embodiments, self-powered solution-processed photo-responsive devices with gigahertz (GHz) response speed are made with OIHP active layer(s). In certain embodiments, charge trapping is eliminated or reduced and constraints from the resistance-capacitance constant are removed to increase their response speed to the GHz range for devices operating at zero bias. The fast response speed enables application in a time-resolved photodetection system that successfully resolves high speed processes such as the decay process of typical fluorescence and phosphorous materials with a recombination lifetime from several nanoseconds to microseconds.

According to an embodiment, a semiconductor device is provided that typically includes a cathode layer, an anode layer, an active layer disposed between the cathode layer and the anode layer, where the active layer includes a perovskite layer, and an electron extraction layer disposed between the cathode layer and the active layer, the electron extraction layer comprising a layer of $C_{60}$ directly disposed on the active layer. In certain aspects the perovskite layer includes organometal trihalide perovskite or $CH_3NH_3PbI_2X$, where X includes at least one of Cl, Br, or I. In certain aspects, the layer of $C_{60}$ has a thickness of between about 1 nm and about 100 nm. In certain aspects, the active layer has a thickness of between about 1 nm and about 10 μm. In certain aspects, the active layer presents an active device area (e.g., light-capturing cross-sectional device area) of between about 0.04 $mm^2$ to about 7 $mm^2$.

According to another embodiment, a semiconductor device is provided that typically includes a cathode layer, an anode layer, and an active layer disposed between the cathode layer and the anode layer, where the active layer includes an organometal trihalide perovskite layer or $CH_3NH_3PbI_2X$ layer, where X includes at least one of Cl, Br, or I. The device also typically includes an electron extraction layer disposed between the cathode layer and the active layer, the electron extraction layer comprising a layer of $C_{60}$ directly disposed on the active layer, a first buffer layer comprising bathocuproine (BCP) and disposed between the electron extraction layer and the cathode, and a second buffer layer comprising Poly[bis(4-phenyl)(2,4,6-trimethylphenyl)amine](PTAA) and disposed between the active layer and the anode. In certain aspects, the layer of $C_{60}$ has a thickness of between about 1 nm and about 100 nm. In certain aspects, the active layer has a thickness of between about 1 nm and about 10 μm. In certain aspects, the active layer presents an active device area (e.g., light-capturing cross-sectional device area) of between about 0.04 $mm^2$ to about 7 $mm^2$.

According to yet another embodiment, a photodetection system is provided that typically includes a photodetector, an excitation source configured to illuminate a target area with excitation light, and a lens system configured to direct light emanating from the target area onto the photodetector. The photodetector typically includes a cathode layer, an anode layer, an active layer disposed between the cathode layer and the anode layer, where the active layer includes a perovskite layer, and an electron extraction layer disposed between the cathode layer and the active layer, the electron extraction layer comprising a layer of $C_{60}$ directly disposed on the active layer. The system also typically includes an intelligence module, comprising one or more processors, configured to process signals received from electrodes connected to the cathode layer and the anode layer and to provide output representative of the received signals or derived from the received signals. In certain aspects, the layer of $C_{60}$ has a thickness of between about 1 nm and about 100 nm. In certain aspects, the active layer has a thickness of between about 1 nm and about 10 μm. In certain aspects, the active layer presents an active device area (e.g., light-capturing cross-sectional device area) of between about 0.04 $mm^2$ to about 7 $mm^2$.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

Figure 1A:
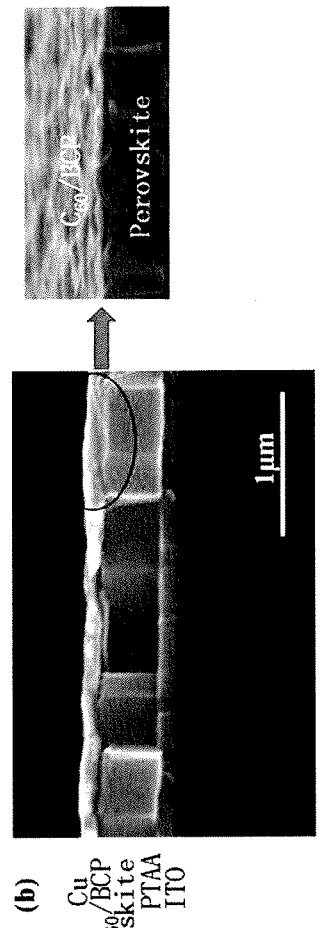
FIG. 1a illustrates a specific device structure of an OIHP photodetector device according to an embodiment.
Figure 1B:
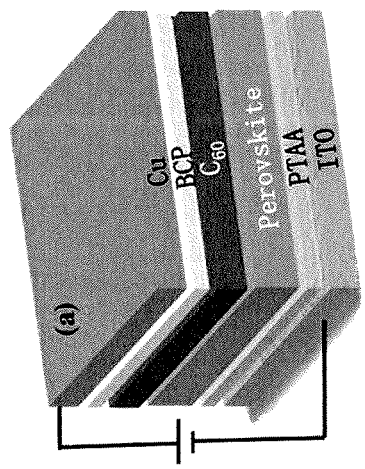
FIG. 1b shows a cross-section SEM image of the OIHP photodetector, inset: a tilted view of perovskite and $C_{60}$/BCP layer.
Figure 1C:
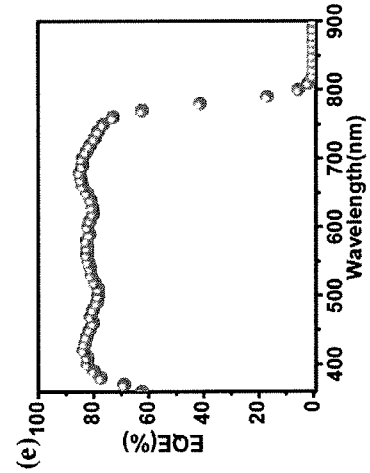
Figure 1D:
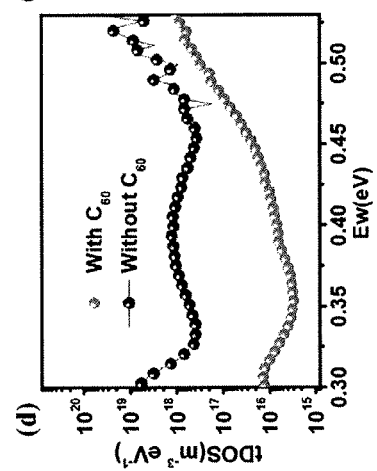
Figure 1E:
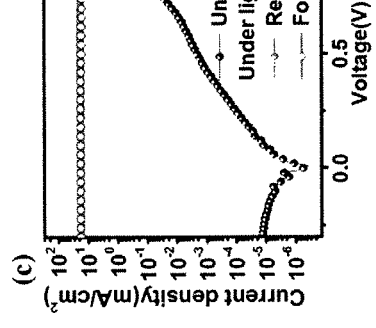
Figure 1F:
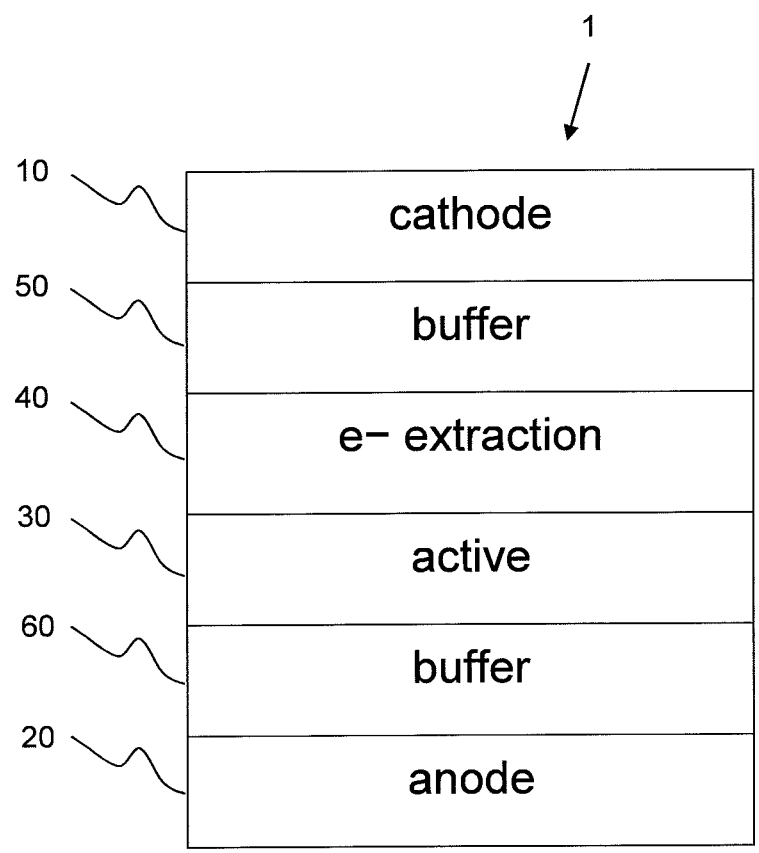
Figure 3A:
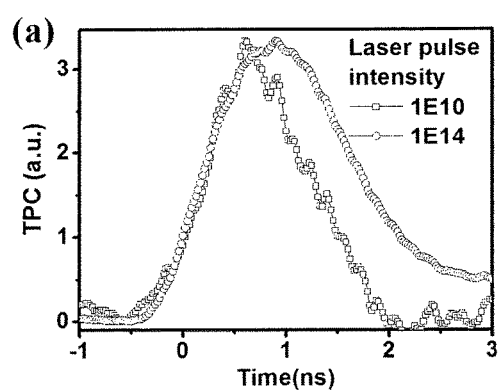
Figure 3B:
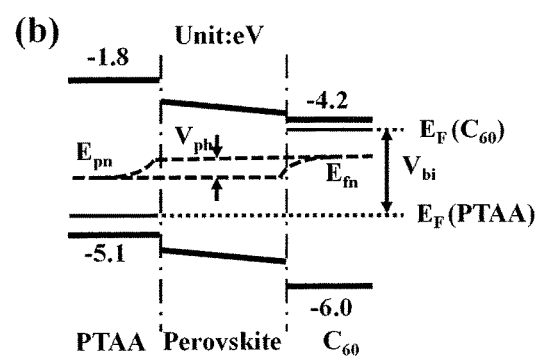
Figure 5:
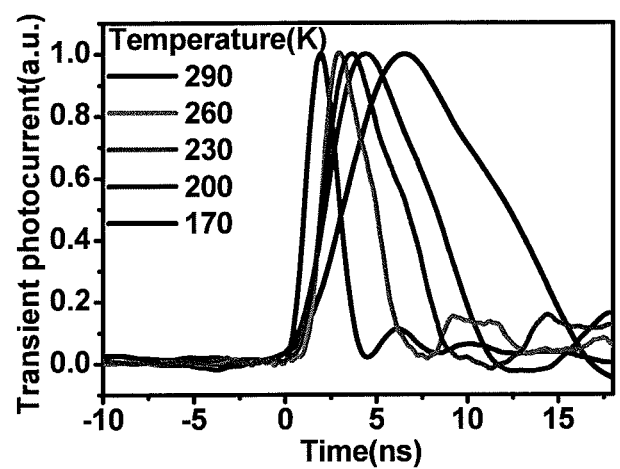
Figure 6:
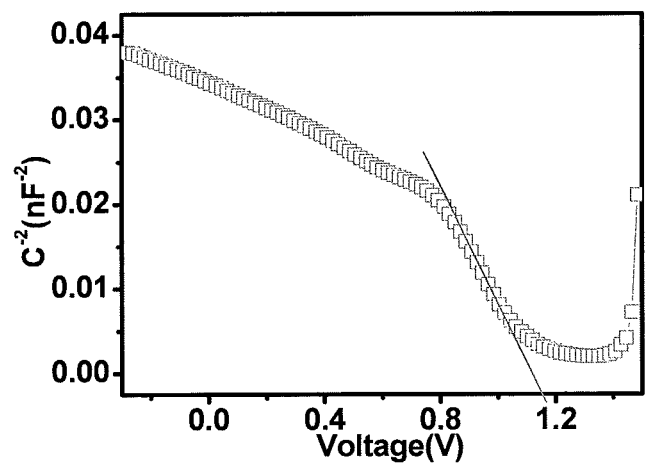
Figures 7A, 7B, 7C:
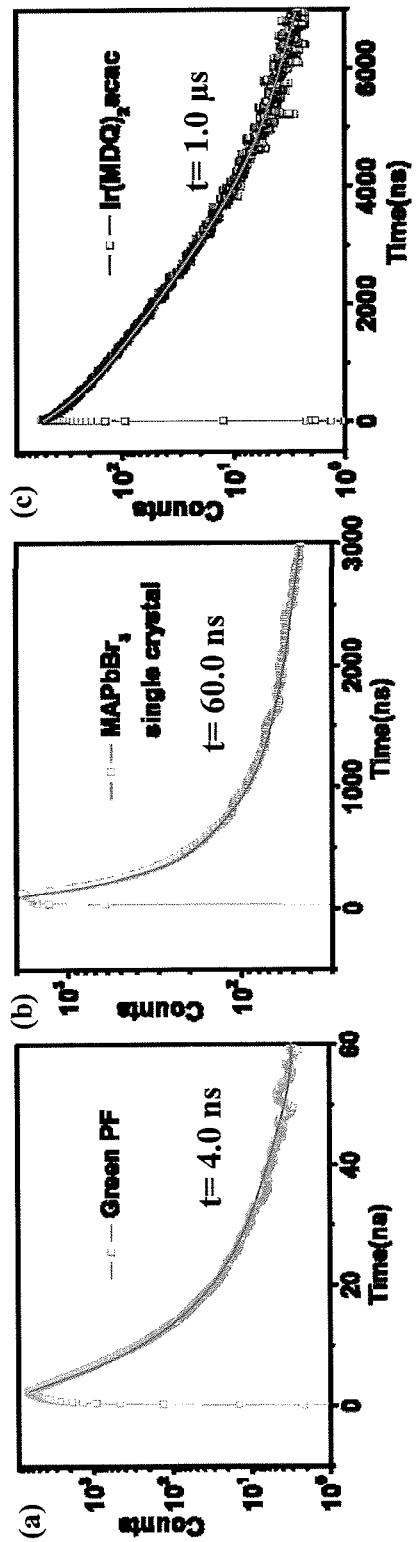

FIG. 1c displays the dark current and photocurrent density curve (under air mass 1.5 global illumination,) of the OIHP photodetector device of FIG. 1a under forward and reverse scanning between −0.3 and 1.6 V;

FIG. 1d displays the measured trap density of state (tDOS) with a thermal admittance spectroscopy (TAS) method before and after introducing $C_{60}$;

FIG. 1e shows the wavelength-dependent external quantum efficiency (EQE) measured at 35 Hz and zero bias;

FIG. 1f illustrates a device structure of an OIHP photodetector device according to an embodiment;

FIG. 2a shows TPC curves of devices with different area from 7 $mm^2$ down to 0.04 $mm^2$, according to an embodiment;

FIG. 2b shows two TPC curves almost overlapped, with a same response time of ~1.0 ns;

FIG. 2c shows the response time increased to 1.4 ns and 2.5 ns for the devices with 50 nm and 80 nm $C_{60}$, respectively;

FIG. 2d shows the magnitude of current increased linearly, while the response time remained invariable at ~1.0 ns with the applied bias;

FIG. 3a shows that the response speed of the perovskite photodetectors increases under weaker light excitation;

FIG. 3b shows a schematic layout of $V_{bi}$ variation of the OIHP photodetector under illumination;

FIG. 4a shows a specific perovskite-based photodetector applied in a TRPL system where an ultrafast photodetector is needed to record the decay process of PL, according to an embodiment;

FIG. 4b shows PL decay curves for Green PF (4.0 ns);

FIG. 4c shows PL decay curves for $MAPbBr_3$ single crystal. (60.0 ns);

FIG. 4d shows PL decay curves for Ir(MDQ)2acac.(1.0 μs);

FIG. 5 shows a graph of transient photocurrent for various temperatures;

FIG. 6 shows a Mott-Schottky curve of OIHP photodetectors;

FIG. 7a shows time-resolved photoluminescence lifetime (TRPL) detection by HORIBA system for Green PF;

FIG. 7b shows time-resolved photoluminescence lifetime (TRPL) detection by HORIBA system for $MAPbBr_3$ single crystal;

FIG. 7c shows time-resolved photoluminescence lifetime (TRPL) detection by HORIBA system for Ir(MDQ)$_2$acac.

DETAILED DESCRIPTION

FIG. 1f illustrates a device structure of an OIHP photodetector device 1 according to an embodiment. As shown, device 1 includes a cathode layer 10, an anode layer 20, and an active layer 30 disposed between the cathode layer 10 and the anode layer 20. Device 1 also includes an electron extraction layer 40 disposed between the cathode layer 10 and the active layer 30. The electron extraction layer 40, in one embodiment, includes a layer of C$_{60}$ directly disposed on the active layer 30. The active layer 30 in an embodiment includes a perovskite layer, where the perovskite layer includes organometal trihalide perovskite (e.g., CH$_3$NH$_3$PbI$_2$X, where X includes at least one of Cl, Br, or I). The active layer 30 should generally have a thickness of between about 1 nm and about 10 μm. depending on the specific application. For example, for typical photodetection applications, a perovskite active layer will have a thickness of about 100 nm to about 2 μm. Additionally, the active layer 30 should generally have an active device area e.g., the cross-sectional light-capturing area, of between about 0.04 mm$^2$ to about 7 mm$^2$, where a smaller active area may be more desirable as will be discussed below.

The anode layer 20 and the cathode layer 10 generally include conductive materials suited for the particular application. Useful materials for the anode layer 20 includes indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene. Useful materials for the cathode layer include copper, aluminum, calcium, magnesium, lithium, sodium, potassium, strontium, cesium, barium, iron, cobalt, nickel, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of at least two of the above materials.

Device 1 optionally includes a first buffer layer 50 disposed between the electron extraction layer 40 and the cathode layer 10, and/or a second buffer layer 60 disposed between the active layer 30 and the anode layer 20. When present, the first buffer layer 50 should have a higher electron conductivity than the second buffer layer 60, and the second buffer layer 60 should have a higher hole conductivity than the first buffer layer 50.

In certain embodiments, the first buffer layer 50 includes at least one of bathocuproine (BCP), poly(3,4-ethylenedioxithiophene) (PEDOT) doped with poly(styrene sulfonicacid) (PSS), 4,4'bis[(ptrichlorosilylpropylphenyl)phenylamino]biphenyl (TPD-Si$_2$), poly(3-hexyl-2,5-thienylene vinylene)(P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrene-sulfonic acid)-graft-poly(aniline) (PSSA-g-PANI), poly[(9,9-dioctylfluorene)-co-N-(4-(1-methylpropyl)phenyl) diphenylamine](PFT), 4,4'bis[(p-trichlorosilylpropylphenyl)phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane Poly[bis(4-phenyl)(2,4,6-trimethylphenyl)amine](PTAA), V$_2$O$_5$, VO$_x$, MoO$_3$, WO$_3$, ReO$_3$, NiO$_x$, AgO$_x$/PEDOT:PSS, Cu$_2$O, CuSCN/P3HT, or Au nanoparticles; and In certain embodiments, the second buffer layer 60 includes at least one of Poly[bis(4-phenyl)(2,4,6-trimethylphenyl)amine](PTAA), LiF, CsF, LiCoO$_2$, CS$_2$CO$_3$, TiO$_x$, TiO$_2$ nanorods (NRs), ZnO, ZnO nanorods (NRs), ZnO nanoparticles (NPs), ZnO, Al$_2$O$_3$, CaO, bathocuproine (BCP), copper phthalocyanine (CuPc), pentacene, pyronin B, [6,6]-phenyl C61-butyric acid methyl ester (PCBM), [6,6]-phenyl C61-butyric acid methyl ester (PC70BM), pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFP-NBr), or poly(ethylene oxide) (PEO).

FIG. 1a illustrates a specific device structure of an OIHP photodetector device 100 according to an embodiment. The specific structure of device 100 is composed of anode: indium tin oxide (ITO)/second buffer: poly(bis(4-phenyl)(2,4,6-trimethylphenyl)amine (PTAA)/active layer: CH$_3$NH$_3$PbI$_3$(MAPbI$_3$)/electron extraction layer: C$_{60}$/first buffer: 2,9-dimethyl-4,7-diphenyl-1,10-phenanthroline (BCP)/cathode: Copper(Cu). Here, the electron extraction layer includes only fullerene (C$_{60}$) only instead of a combination of material layers, such as a phenyl-C61-butyric acid methyl ester (PC$_{61}$BM)/C$_{60}$ double layer, to enhance the response speed of the device because the mobility of C60 is at least one order of magnitude higher than that of PC$_{61}$BM. The non-wetting PTAA plays an advantageous role in increasing the grain size and decreasing the grain boundary area, which can be clearly seen in FIG. 1b from the cross-section scanning electron microscopy (SEM) image of the perovskite film on PTAA. Each perovskite grain directly connected cathode to anode, which indicates that the 500-nm thin film perovskite layer can be regarded as many single crystals for charge transport and collection. It also can be seen that 30 nm C$_{60}$/8 nm BCP layers can completely cover the perovskite layer, which avoids the direct contact between the perovskite layer and cathode metal to avoid possible reaction between them. It should be appreciated that other thicknesses of electron extraction layer and/or buffer layer may be used.

Performance of the OIHP photodetectors: FIG. 1c displays the dark current and photocurrent density curve (under air mass 1.5 global illumination,) of the OIHP photodetector device 100 under forward and reverse scanning between −0.3 and 1.6 V. The dark current density is 1.4×10$^{-5}$ mA cm$^{-2}$ under −0.3 V, which is low enough to resolve light as weak as sub-picowatt per square centimeter as demonstrated previously (Fang Y, Huang J. Resolving Weak Light of Sub-picowatt per Square Centimeter by Hybrid Perovskite Photodetectors Enabled by Noise Reduction. Adv. Mater. 27, 2804-2810 (2015).). This low dark current can be attributed to the facts that the C$_{60}$ layer completely covered the perovskite layer and effectively reduced the current leakage. FIG. 1d displays the measured trap density of state (tDOS) with a thermal admittance spectroscopy (TAS) method before and after introducing C60. There was a relatively large density of defect states of 1×10$^{17}$-1×10$^{19}$ m$^{-3}$ eV$^{-1}$ in the device without C$_{60}$. However, the tDOS decreased by nearly two orders of magnitude for trap depth below 0.45 eV, and by at least one order of magnitude for trap depth above 0.45 eV. The clear reduction of tDOS provides direct evidence that C$_{60}$ can effectively reduce perovskite surface traps by passivation, which advantageously achieves the fast electron extraction and fast response of the photodetector device embodiments herein. Meanwhile, no photocurrent hysteresis appeared in the photodetectors, which benefits from the passivation role that C$_{60}$ plays in reducing perovskite surface trap density. FIG. 1e shows the wavelength-dependent external quantum efficiency (EQE) measured at 35 Hz and zero bias. The EQE curve is almost flat and above 80% in whole visible wavelength, suggesting a constant charge collection efficient for charges generated by short or long wavelength near PTAA surface as well as in the perovskite grains.

The low trap density and high mobility of the single-crystal like perovskite layer allows for perovskite-based (e.g., MAPbI$_3$-based) photodetectors to have a fast response. However the resistance-capacitance (RC) constant of the devices is usually inevitably mixed with carrier transit time and can cause difficulty in knowing the device response speed limit. The temporal response of a photodetector is characterized by 3 decibel (dB) bandwidth which is the frequency of light signal at which the photoresponse is half of that under steady light. The response bandwidth is affected by both charge carrier transit time (t) and RC constant, and is limited by the slower one [35]:

$$f_{-3\,dB}^{-2} = \left(\frac{3.5}{2\pi t}\right)^{-2} + \left(\frac{1}{2\pi RC}\right)^{-2} \quad (1)$$

where R is the total series resistance including the photodiode resistance, contact resistances and load resistances in the measurement circuit. C is the sum of capacitance of the device as well parasitic capacitance of the measurement system. To eliminate the RC time constant influence, photodetectors with varied device area were firstly investigated. The response speed was measured by a transient photocurrent (TPC) method. A short pulse of light from a pulse laser was used to generate carriers in photodetectors which are driven toward the respective electrode by the built-in potential field or an external voltage bias. The induced photocurrent pulse (or TPC curve) is recorded by a fast oscilloscope with an input resistor of 50 ohm. By a single exponential fitting, the response speed can be defined from the linear regime extending out beyond the peak, all the way down to approximately to "1/e" time of the photocurrent decay. Here, the laser pulse was provided by either a Ti-sapphire femtosecond (fs) laser with an emission wavelength of 400 nm by doubling the frequency and pulse duration of 150 fs, at a repeating frequency of 1 KHz or a nitrogen nanosecond (ns) pulse laser with an emission wavelength of 337 nm and pulse duration of 3.5 ns, at a repeating frequency of 20 Hz. The response curve is measured by a 1 GHz oscilloscope which has a sampling rate of 5 GHz. It can be seen that the device response times are clearly device-area dependent: 115.1 ns for 7 mm$^2$, 35.3 ns for 2 mm$^2$, 17.9 ns for 1 mm$^2$, 9.0 ns for 0.5 mm$^2$, 2.7 ns for 0.15 mm$^2$, 1.0 ns for 0.04 mm$^2$, respectively. The response time of 1.0 ns, which corresponds to a response speed of 1 GHz, is the fastest response speed reported in OIHP photodetectors which is at least two orders of magnitudes faster than in previous reports. To figure out whether the intrinsic response speed limit of these photodetectors has been reached, a simple estimation of the transit time of the devices based on the reported carrier mobility of the materials was done. The detail calculation can be found in the Appendix A, which gives a transit time between 0.97 ns and 3.67 ns, depending on the mobility of C$_{60}$ used, which is dominated by the transit time of C$_{60}$ layer. It is thus concluded that the measured 1.0 ns response time is a true device transit time, because the RC constant is much shorter than the transit time when the device area is less than 0.04 mm$^2$ (Appendix A, Table I). The rising time of the TPC curve is also limited by the RC constant of the device or the transit time as well which is comparable to the decay time for the smallest area devices discussed herein, regardless of the laser pulse durations of 150 fs or 3.5 ns.

A study of what limits the measured transit time continued by examining both the devices and equipment setup. The devices have three layers: the hole transport layer, the perovskite layer and the electron transport layer. Each of these layers may possess a limitation to the transit time. The PTAA hole transport layer was excluded as the limiting one because of its very small thickness of 1-5 nm and reasonably good hole mobility of 10$^{-3}$ cm$^2$ V$^{-1}$s$^{-1}$. Thus, the thickness of perovskite layer was increased from 900 nm to 1.2 μm to find its influence to measured transit time. As shown in FIG. 2b, the two TPC curves almost overlapped, with a same response time of ~1.0 ns. This indicates that the perovskite layer does not limit the transient time despite of it having the largest thickness in the device structure, which can be explained by its high enough mobility. Then, the thickness of C$_{60}$ was increased from 30 nm to 50 nm and 80 nm. As illustrated in FIG. 2c, the response time increased to 1.4 ns and 2.5 ns for the devices with 50 nm and 80 nm C$_{60}$, respectively. The measured transit time constants agree well with the calculated values with a mobility of 0.05 cm$^2$ V$^{-1}$s$^{-1}$ for C$_{60}$ (see Appendix A). This clearly shows that the low mobility of C$_{60}$ is limiting the device response speed when it is too thick. The temperature dependent device response speed study also confirmed the limiting factor to be the fullerene layer (FIG. 5). The device response speed became slower with the reduced temperature. Perovskites have band-transport property and thus a higher mobility at lower temperature, while fullerenes have reduced mobility at low temperature because of the nature of thermally activated hopping transport. The slowing down of device response speed must originate from the smaller mobility of fullerene at a lower temperature, providing direct evidence that the fullerene layer is the limiting factor at both room temperature and low temperatures. Finally, to further find whether the response speed is limited by instrument for the quickest devices with 30 nm C$_{60}$, a voltage pulse from a Keithley instrument 4200 was applied on the OIHP photodetectors to find its response speed variation. An increased bias is expected to shorten the transit time by increasing the carrier drift velocity. The pulse bias was applied onto the OHIP photodetectors right after before laser pulse to minimize the influence of ion migration so that a large bias can be applied. As shown in FIG. 2d, the magnitude of current increased linearly, while the response time remained invariable at ~1.0 ns with the applied bias. This indicates the 1 GHz response speed read out from the oscilloscope was limited by the used 1 GHz oscilloscope, and the actual response speed is beyond 1 GHz, which agrees with the calculated response speed of 1.5 GHz for the devices with an active area of 0.04 mm$^2$ (Appendix A, Table I)

It is noted that the response speed of the perovskite photodetectors increases under weaker light excitation, as shown in FIG. 3a. This can be explained by the decreased screening of the built-in electric field by the photogenerated space-charges. The built-in potential in these photodetectors can be estimated from the C-V measurement which is around 1.1 V (FIG. 6). The energy diagrams of the perovskite photodetector in the dark and under illumination are shown in FIG. 4b. In the dark, the perovskite layer is completely depleted, because the depletion depth derived from the C-V measurement covers the whole perovskite thickness (Appendix A). The close to intrinsic nature of the perovskite films, as evidenced by results of Hall effect and ultraviolet photoelectron spectroscopy measurements, gives rise to the large depletion width in these devices. Under light, the photovoltage generated by the Fermi level splitting in the perovskite layer is opposite to built-in potential direction, and the built-in potential is thus weakened by the screening effect of photogenerated charges, resulting in a slower response under stronger excitation for the photodetectors.

A time-resolved photoluminescence (TRPL) system with OIHP photodetectors. According to an embodiment, a photodetection system includes an excitation source, configured to illuminate a target area with excitation light, a lens system configured to direct and/or image light emanating from the target area onto a photodetector, and an intelligence module, comprising a processor, configured to process signals received from electrodes connected to the cathode layer(s) and the anode layer(s) of the photodetector. The photodetector may include a single element or an array of elements, e.g., pixels. For example, each photodetector element may include a cathode layer, an anode layer, an active layer disposed between the cathode layer and the anode layer, where the active layer includes a perovskite layer, and an electron extraction layer disposed between the cathode layer and the active layer, the electron extraction layer comprising a layer of $C_{60}$ directly disposed on the active layer. The excitation source may include a laser, e.g., pulsed, or cw with optoelectronics configured to chop or pulse the laser beam.

FIG. 4a shows a specific perovskite-based photodetector according to an embodiment applied in a TRPL system where an ultrafast photodetector is needed to record the decay process of PL. PL lifetime is an important parameter in understanding the properties of optoelectronic materials for applications of light emitting diode, semiconductor laser, and solar cells. It is an important parameter to reflect the nature and quality of materials, which is highly dependent on the impurities, defects (both bulk and surface), and presence of dopants. TRPL by time-correlated single photon counting (TCSPC) is a general method to determine fast charge carrier dynamics in optoelectronic materials. The essential components of a TCSPC system for measuring PL lifetime includes a pulsed laser, single-photon sensitive photodetector, optical filters or monochromators to separate fluorescence signal from excitation light and wavelength selection. The high-sensitivity, sub-nanosecond photodetector provides an ability to monitor the carrier lifetime, because the 1 GHz response speed is fast enough to follow the lifetime of many conventional semiconductor materials applied for optoelectronic devices.

As shown in FIG. 4a, a specific measurement system of carrier lifetime has been set up. A nitrogen nanosecond laser was used for excitation. The laser illuminates a target area, e.g., samples on a target platform, from a small angle. The samples were placed at the focus position of lens 1, and the photoluminescence light from the samples was collected and redirected to a GHz perovskite photodetector by lens 2. A filter (e.g., bandpass filter, or other filter) was placed in front of the photodetector to filter the scattered excitation light. The GHz perovskite photodetector was connected with a 1 GHz oscilloscope with 50 ohm input resistance. The signals were recorded in the form of the transient current, and fitting the time decay gives the carrier lifetime. Three types of typical organic and hybrid materials, green polyfluorene (PF), methylammounium lead tri-bromide ($MAPbBr_3$) single crystal, and Bis(2-methyldibenzo[f,h]quinoxaline) (acetylacetonate) iridium(III) ($Ir(MDQ)_2(acac)$) were chosen to measure the PL lifetime, and the TPC responses are shown in FIG. 4b-d. After fitting the decay curves, the lifetimes are derived as ~4.0 ns for green PF, ~60.0 ns for the $MAPbBr_3$ single crystals and ~1.0 µs for $Ir(MDQ)_2acac$. In order to check the accuracy of these measurements, those samples were measured with a commercial HORIBA TCSPC system. The PL lifetime measured by TCSPC system agree very well with that of the system (FIG. 7). It should be noted that perovskite photodetectors used here need neither cooling nor power to operate, and their cost is much less than existing commercial detectors.

The observation of ultra-fast extraction of photogenerated carriers in perovskite photodetectors also provides important insight in understanding the high efficiency solar cell devices, because they have a very similar structure. The charge extraction of rate reported here is significantly slower than the phonon cooling rate. The preservation of high energy hot electrons by quick charge extraction may contribute to the large open circuit voltage of perovskite solar cells. This result also answers another puzzle on whether bulk-heterojunction could form in perovskite solar cells by infiltration of fullerenes into the grain boundaries. The significantly large mobility and quick extraction of charges makes this scenario highly unlikely, because charge carriers would prefer to transport through the perovskite layer which represents a high-way for carrier transport. The fullerenes in grain boundaries only play the function of trap passivation instead of carrier transport, though the fullerene thin layer close to the cathode electrode eventually accepts electrons and transports them to the cathode.

EXAMPLES

Device fabrication. PTAA dissolved in toluene was spun on clean ITO substrates at a speed of 5,000 rounds per minute (rpm). The film was then annealed at 100° C. for 10 min. $PbI_2$ and MAI were dissolved in dimethylformamide (DMF) and 2-propanol with concentrations of 630 mg ml$^{-1}$ and 65 mg ml$^{-1}$, respectively. The $PbI_2$ solution was spun on a PTAA layer at 6,000 rpm for 35 s. Then the $PbI_2$ film was transferred onto a hot plate at 90° C. for quick drying. Afterwards, the MAI solution was spun on top of the $PbI_2$ film at 6,000 rpm for 35 s at room temperature, combined with a thermally annealing at 100° C. for 1 h. Finally, the device was completed by thermal evaporating $C_{60}$ (30 nm), BCP (8 nm) and Cu (80 nm) in sequential order.

Device characterization.

AM 1.5G simulated irradiation with an intensity of 100 mW cm$^{-2}$ was produced by a Xenon-lamp-based solar simulator (Oriel 67005, 150 W) for Current (I)-voltage (V) measurements. The light intensity was calibrated by a silicon diode (Hamamatsu S 1133). A Keithley 2400 Sourcemeter was employed for I-V measurements. The voltage scanning rate was 0.1 Vs$^{-1}$. A keithley 4200 Sourcemeter was used to add pulse bias to device. The thermal admittance spectroscopy and capacitance-voltage characteristic were performance by Agilent E4980 A Precision LCR Meter. The temperature dependence of response speed is measured by the LNP95 cooling system (Linkam Co.). The OIHP photodetectors was sealed in a cooling stage and the temperature is precisely controlled by liquid nitrogen flow with a cooling/heating rate of 5° C./min. Each temperature point was held for 30 min before the response speed was recorded. All the cables that connect the device and oscilloscope need to be as short as possible, and connected with a fast (6 GHz) Bayonet Neill-Concelman (BNC) connector to minimize the influence of the inductance of the circuit.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:
1. A semiconductor device, comprising:
a cathode layer comprising copper;
an anode layer comprising indium tin oxide (ITO);
an active layer disposed between the cathode layer and the anode layer, where the active layer includes a perovskite layer, wherein the perovskite layer includes an organometal trihalide perovskite or $CH_3NH_3PbI_2X$, where X includes at least one of Cl, Br, or I; and
an electron extraction layer disposed between the cathode layer and the active layer, the electron extraction layer comprising a layer of $C_{60}$ directly disposed on the active layer.

2. The semiconductor device of claim 1, further comprising:
a first buffer layer disposed between the electron extraction layer and the cathode; and
a second buffer layer disposed between the active layer and the anode, the first buffer layer having a higher electron conductivity than the second buffer layer, the second buffer layer having a higher hole conductivity than the first buffer layer.

3. The semiconductor device of claim 1, wherein the layer of $C_{60}$ has a thickness of between about 1 nm and about 100 nm.

4. The semiconductor device of claim 1, wherein the active layer has a thickness of between about 1 nm and about 10 μm.

5. The semiconductor device of claim 2, wherein:
the first buffer layer comprises at least one of bathocuproine (BCP), poly(3,4-ethylenedioxithiophene) (PEDOT) doped with poly(styrene sulfonicacid) (PSS), 4,4'bis[(ptrichlorosilylpropylphenyl)phenylamino]biphenyl (TPD-Si$_2$), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'bis[(p-trichlorosilylpropylphenyl)phenylamino] biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or3-aminopropyltrhoxysilanepoly[bis(4-phenyl)(2, 4, 6-trimethylphenyl amine ] (PTAA), $V_2O_5$, $VO_x$, $MoO_3$, $WO_3$, $ReO_3$, NiOx, $AgO_x$/PEDOT:PSS, $Cu_2O$, CuSCN/P3HT, or Au nanoparticles; and
the second buffer layer comprises at least one of Poly[bis(4-phenyl)(2,4,6-trimethylphenyl) amine] (PTAA), LiF, CsF, LiCoO$_2$, CS2CO$_3$, TiO$_x$, TiO$_2$ nanorods (NRs), ZnO, ZnO nanorods (NRs), ZnO nanoparticles (NPs), ZnO, Al$_2$O$_3$, CaO, bathocuproine (BCP), copper phthalocyanine (CuPc), pentacene, pyronin B, [6,6]-phenyl C$_{61}$-butyric acid methyl ester (PCBM), [6,6]-phenyl C$_{61}$-butyric acid methyl ester (PC70BM), pentadecafluorooctyl phenyl-C$_{60}$-butyrate (F-PCBM), C$_{60}$, C$_{60}$/LiF, ZnO NRs/PCBM, ZnO/cross-linked fullerene derivative (C-PCBSD), single walled carbon nanotubes (SWCNT), poly(ethylene glycol) (PEG), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFNBr), or poly(ethylene oxide) (PEO).

6. A semiconductor device, comprising:
a cathode layer comprising copper;

an anode layer comprising indium tin oxide (ITO);

an active layer disposed between the cathode layer and the anode layer, where the active layer includes an organometal trihalide perovskite layer or $CH_3NH_3PbI_2X$, where X includes at least one of Cl, Br, or I;

an electron extraction layer disposed between the cathode layer and the active layer, the electron extraction layer comprising a layer of $C_{60}$ directly disposed on the active layer;

a first buffer layer comprising bathocuproine (BCP) and disposed between the electron extraction layer and the cathode; and a second buffer layer comprising Poly[bis(4-phenyl)(2,4,6-trimethylphenyl)amine] (PTAA) and disposed between the active layer and the anode.

7. The semiconductor device of claim 6, wherein the layer of $C_{60}$ has a thickness of between about 1 nm and about 100 nm.

8. The semiconductor device of claim 6, wherein the active layer has a thickness of between about 1 nm and about 10 μm.

9. The semiconductor device of claim 6, wherein the active layer presents an active device area of between about 0.04 mm² to about 7 mm².

10. A photodetection system, comprising:

an excitation source, configured to illuminate a target area with excitation light;

a lens system configured to direct light emanating from the target area onto a photodetector;

the photodetector, wherein the photodetector comprises:
    a cathode layer comprising copper
    an anode layer comprising indium tin oxide (ITO);
    an active layer disposed between the cathode layer and the anode layer, where the active layer includes a perovskite layer, wherein the perovskite layer includes an organometal trihalide perovskite or $CH_3NH_3PbI_2X$, where X includes at least one of Cl, Br, or I; and
    an electron extraction layer disposed between the cathode layer and the active layer, the electron extraction layer comprising a layer of $C_{60}$ directly disposed on the active layer; and an intelligence module, comprising a processor, configured to process signals received from electrodes connected to the cathode layer and the anode layer.

11. The system of claim 10, wherein the excitation light has a first frequency bandwidth, and wherein the light emanating from the target area includes light having a second sample bandwidth different from the first frequency bandwidth.

12. The system of claim 10, further including a filter position between the target area and the photodetector, the filter configured to filter the excitation light.

* * * * *